US011897079B2

(12) United States Patent
Wu et al.

(10) Patent No.: US 11,897,079 B2
(45) Date of Patent: Feb. 13, 2024

(54) LOW-TEMPERATURE METAL CMP FOR MINIMIZING DISHING AND CORROSION, AND IMPROVING PAD ASPERITY

(71) Applicant: Applied Materials, Inc., Santa Clara, CA (US)

(72) Inventors: Haosheng Wu, San Jose, CA (US); Hari Soundararajan, Sunnyvale, CA (US); Jianshe Tang, San Jose, CA (US); Shou-Sung Chang, Mountain View, CA (US); Brian J. Brown, Palo Alto, CA (US); Yen-Chu Yang, Santa Clara, CA (US); You Wang, Cupertino, CA (US); Rajeev Bajaj, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 643 days.

(21) Appl. No.: 16/831,436

(22) Filed: Mar. 26, 2020

(65) Prior Publication Data

US 2021/0046602 A1     Feb. 18, 2021

Related U.S. Application Data

(60) Provisional application No. 62/886,287, filed on Aug. 13, 2019.

(51) Int. Cl.
*B24B 37/015*     (2012.01)
*B24B 55/03*     (2006.01)
(Continued)

(52) U.S. Cl.
CPC .......... *B24B 37/015* (2013.01); *B24B 37/105* (2013.01); *B24B 55/03* (2013.01);
(Continued)

(58) Field of Classification Search
CPC ..... B24B 37/015; B24B 37/105; B24B 55/03; B24B 37/042; B24B 49/14
(Continued)

(56) References Cited

U.S. PATENT DOCUMENTS

| 4,450,652 A | 5/1984 | Walsh |
| 4,919,232 A | 4/1990 | Lofton |

(Continued)

FOREIGN PATENT DOCUMENTS

| CN | 101500721 | 8/2009 |
| CN | 102179757 | 9/2011 |

(Continued)

OTHER PUBLICATIONS

English translation of TW 201304908A1 (Year: 2013).*

(Continued)

*Primary Examiner* — Joel D Crandall
*Assistant Examiner* — Sukwoo James Chang
(74) *Attorney, Agent, or Firm* — Fish & Richardson P.C.

(57) ABSTRACT

A chemical mechanical polishing system includes a platen to support a polishing pad having a polishing surface, a source of coolant, a dispenser having one or more apertures suspended over the platen to direct coolant from the source of coolant onto the polishing surface of the polishing pad; and a controller coupled to the source of coolant and configured to cause the source of coolant to deliver the coolant through the nozzles onto the polishing surface during a selected step of a polishing operation.

18 Claims, 7 Drawing Sheets

(51) Int. Cl.
  *B24B 37/10*  (2012.01)
  *H01L 21/306*  (2006.01)
  *B24B 49/14*  (2006.01)
  *B24B 37/04*  (2012.01)

(52) U.S. Cl.
  CPC ............. *B24B 37/042* (2013.01); *B24B 49/14* (2013.01); *H01L 21/30625* (2013.01)

(58) Field of Classification Search
  USPC .......................................................... 451/7
  See application file for complete search history.

(56) References Cited

U.S. PATENT DOCUMENTS

| | | |
|---|---|---|
| 5,088,242 A | 2/1992 | Lubbering et al. |
| 5,196,353 A | 3/1993 | Sandhu et al. |
| 5,478,435 A | 12/1995 | Murphy et al. |
| 5,597,442 A | 1/1997 | Chen et al. |
| 5,643,050 A | 7/1997 | Chen |
| 5,709,593 A | 1/1998 | Guthrie |
| 5,722,875 A | 3/1998 | Iwashita et al. |
| 5,738,574 A | 4/1998 | Tolles et al. |
| 5,762,544 A | 6/1998 | Zuniga et al. |
| 5,765,394 A | 6/1998 | Rhoades |
| 5,851,135 A | 12/1998 | Sandhu et al. |
| 5,851,846 A | 12/1998 | Matsui et al. |
| 5,868,003 A | 2/1999 | Simas et al. |
| 5,873,769 A | 2/1999 | Chiou et al. |
| 5,893,753 A | 4/1999 | Hempel, Jr. |
| 5,957,750 A | 9/1999 | Brunelli |
| 6,000,997 A | 12/1999 | Kao et al. |
| 6,012,967 A | 1/2000 | Satake et al. |
| 6,023,941 A | 2/2000 | Rhoades |
| 6,095,898 A | 8/2000 | Hennofer et al. |
| 6,121,144 A | 9/2000 | Marcyk et al. |
| 6,151,913 A | 11/2000 | Lewis et al. |
| 6,159,073 A | 12/2000 | Wiswesser et al. |
| 6,257,954 B1 | 7/2001 | Ng et al. |
| 6,257,955 B1 | 7/2001 | Springer et al. |
| 6,264,789 B1 | 7/2001 | Pandey et al. |
| 6,280,289 B1 | 8/2001 | Wiswesser et al. |
| 6,315,635 B1 | 11/2001 | Lin |
| 6,319,098 B1 | 11/2001 | Osterheld et al. |
| 6,399,501 B2 | 6/2002 | Birang et al. |
| 6,402,597 B1 * | 6/2002 | Sakurai ................. B24B 53/017 451/53 |
| 6,422,927 B1 | 7/2002 | Zuniga |
| 6,461,980 B1 | 10/2002 | Cheung et al. |
| 6,494,765 B2 | 12/2002 | Gitis et al. |
| 6,503,131 B1 | 1/2003 | Franklin et al. |
| 6,543,251 B1 | 4/2003 | Gasteyer, III et al. |
| 6,640,151 B1 | 10/2003 | Somekh et al. |
| 6,647,309 B1 | 11/2003 | Bone |
| 6,776,692 B1 | 8/2004 | Zuniga et al. |
| 6,829,559 B2 | 12/2004 | Bultman et al. |
| 6,887,132 B2 | 5/2005 | Kajiwara et al. |
| 6,896,586 B2 | 5/2005 | Pham et al. |
| 7,008,295 B2 | 3/2006 | Wiswesser et al. |
| 7,016,750 B2 | 3/2006 | Steinkirchner et al. |
| 7,196,782 B2 | 3/2007 | Fielden et al. |
| 7,201,634 B1 | 4/2007 | Naujok et al. |
| 7,234,224 B1 | 6/2007 | Naugler et al. |
| 8,133,756 B2 | 3/2012 | Park et al. |
| 8,172,641 B2 | 5/2012 | Ho et al. |
| 8,349,247 B2 | 1/2013 | Ueno |
| 8,398,463 B2 * | 3/2013 | Bajaj ................. B24B 53/095 451/28 |
| 8,439,723 B2 | 5/2013 | Marks et al. |
| 8,740,667 B2 | 6/2014 | Kodera et al. |
| 8,845,391 B2 | 9/2014 | Sone et al. |
| 8,871,644 B2 * | 10/2014 | Matsui ................. B24B 53/017 438/692 |
| 9,005,999 B2 | 4/2015 | Xu et al. |
| 9,067,296 B2 | 6/2015 | Ono et al. |
| 9,475,167 B2 | 10/2016 | Maruyama et al. |
| 9,539,699 B2 | 1/2017 | Shinozaki |
| 9,579,768 B2 | 2/2017 | Motoshima et al. |
| 9,630,295 B2 | 4/2017 | Peng et al. |
| 9,782,870 B2 | 10/2017 | Maruyama et al. |
| 10,035,238 B2 | 7/2018 | Maruyama et al. |
| 10,086,543 B2 | 10/2018 | Cantrell |
| 11,103,970 B2 | 8/2021 | Huang et al. |
| 2001/0055940 A1 | 12/2001 | Swanson |
| 2002/0039874 A1 | 4/2002 | Hecker et al. |
| 2002/0058469 A1 | 5/2002 | Pinheiro et al. |
| 2002/0065002 A1 | 5/2002 | Handa et al. |
| 2002/0065022 A1 | 5/2002 | Iwasaki et al. |
| 2002/0068454 A1 | 6/2002 | Sun et al. |
| 2003/0055526 A1 | 3/2003 | Avanzino et al. |
| 2003/0211816 A1 | 11/2003 | Liu et al. |
| 2004/0087248 A1 | 5/2004 | Hirokawa |
| 2005/0024047 A1 | 2/2005 | Miller et al. |
| 2005/0042877 A1 | 2/2005 | Salfelder et al. |
| 2005/0181709 A1 | 8/2005 | Jiang et al. |
| 2005/0211377 A1 | 9/2005 | Chen et al. |
| 2007/0035020 A1 | 2/2007 | Umemoto |
| 2007/0135020 A1 | 6/2007 | Nabeya |
| 2007/0205112 A1 | 9/2007 | Kodera et al. |
| 2007/0227901 A1 | 10/2007 | Hu et al. |
| 2007/0238395 A1 | 10/2007 | Kimura et al. |
| 2008/0311823 A1 | 12/2008 | Aiuoshizawa et al. |
| 2009/0258573 A1 | 10/2009 | Muldowney et al. |
| 2010/0047424 A1 | 2/2010 | Cousin et al. |
| 2010/0081360 A1 | 4/2010 | Xu et al. |
| 2010/0227435 A1 | 9/2010 | Park et al. |
| 2010/0279435 A1 | 11/2010 | Xu et al. |
| 2011/0159782 A1 | 6/2011 | Sone et al. |
| 2012/0034846 A1 | 2/2012 | Minamihaba et al. |
| 2012/0040592 A1 | 2/2012 | Chen et al. |
| 2012/0190273 A1 | 7/2012 | Ono et al. |
| 2012/0220196 A1 | 8/2012 | Maruyama et al. |
| 2013/0023186 A1 | 1/2013 | Motoshima et al. |
| 2013/0045596 A1 | 2/2013 | Eda et al. |
| 2013/0331005 A1 | 12/2013 | Akifumi et al. |
| 2014/0024297 A1 | 1/2014 | Cahndraeskaran et al. |
| 2014/0187122 A1 | 7/2014 | Ishibashi |
| 2014/0315381 A1 * | 10/2014 | Wang ................. H01L 21/76873 438/618 |
| 2014/0323017 A1 | 10/2014 | Tang et al. |
| 2015/0024661 A1 | 1/2015 | Peng et al. |
| 2015/0079881 A1 | 3/2015 | Maruyama et al. |
| 2015/0196988 A1 | 7/2015 | Watanabe |
| 2015/0224621 A1 | 8/2015 | Motoshima et al. |
| 2015/0224623 A1 | 8/2015 | Xu et al. |
| 2016/0167195 A1 | 6/2016 | Diao et al. |
| 2016/0236318 A1 | 8/2016 | Choi et al. |
| 2017/0232572 A1 | 8/2017 | Brown |
| 2018/0236631 A1 | 8/2018 | Eto et al. |
| 2018/0290263 A1 * | 10/2018 | Sotozaki ............... B24B 37/042 |
| 2019/0126428 A1 | 5/2019 | Martuyama et al. |
| 2019/0143476 A1 | 5/2019 | Wu |
| 2019/0143477 A1 * | 5/2019 | Baba ................. H01L 21/7684 438/693 |
| 2020/0001425 A1 | 1/2020 | Huang |
| 2020/0001426 A1 | 1/2020 | Soundararajan et al. |
| 2020/0001427 A1 | 1/2020 | Soundararajan et al. |
| 2020/0262024 A1 | 8/2020 | Chang et al. |
| 2021/0046603 A1 | 2/2021 | Wu et al. |
| 2021/0046604 A1 | 2/2021 | Wu et al. |

FOREIGN PATENT DOCUMENTS

| | | | |
|---|---|---|---|
| CN | 102419603 | 4/2012 | |
| CN | 103708714 A * | 4/2014 | ............. C03B 33/02 |
| CN | 107696361 | 2/2018 | |
| CN | 207171777 | 4/2018 | |
| CN | 109719615 | 5/2019 | |
| EP | 2532478 | 12/2012 | |
| JP | H11-033897 | 2/1999 | |
| JP | H 11-277410 | 10/1999 | |
| JP | 2001-060725 | 3/2001 | |
| JP | 2003-197586 | 7/2003 | |
| JP | 2004-202666 | 7/2004 | |

(56) References Cited

FOREIGN PATENT DOCUMENTS

| | | | | |
|---|---|---|---|---|
| JP | 2004-306173 | 11/2004 | | |
| JP | 2005-046947 | 2/2005 | | |
| JP | 2005-203522 | 7/2005 | | |
| JP | 2005-311246 | 11/2005 | | |
| JP | 2006-237445 | 9/2006 | | |
| JP | 2007-035973 | 2/2007 | | |
| JP | 2008-137148 | 6/2008 | | |
| JP | 2013-022664 | 2/2013 | | |
| JP | 2013-042066 | 2/2013 | | |
| JP | 2013-099814 | 5/2013 | | |
| JP | 2014-188596 | 10/2014 | | |
| JP | 2015-104769 | 6/2015 | | |
| JP | 2015-131361 | 7/2015 | | |
| JP | 2018-101738 | 6/2018 | | |
| JP | 2019-081241 | 5/2019 | | |
| KR | 2009-0046468 | 5/2009 | | |
| KR | 20100101379 | A * | 9/2010 | ........... B24B 37/015 |
| KR | 2012-0084671 | 7/2012 | | |
| KR | 2020-0056015 | 5/2020 | | |
| TW | 201101385 | 1/2011 | | |
| TW | 201304908 | 1/2013 | | |
| TW | 202000368 | 1/2020 | | |
| WO | WO 90/13735 | 11/1990 | | |
| WO | WO 2000/58054 | 10/2000 | | |
| WO | WO 02/17411 | 2/2002 | | |
| WO | WO. 2014/113220 | 7/2014 | | |
| WO | WO2017049763 | A1 * | 3/2017 | ............. B24B 19/22 |
| WO | WO 2018/034308 | 2/2018 | | |
| WO | WO 2020/005749 | 1/2020 | | |

OTHER PUBLICATIONS

English translation of WO 2017049763A1 (Year: 2017).*
English translation of CN 103708714A (Year: 2014).*
English translation of KR 20100101379A (Year: 2010).*
Office Action in Taiwanese Appln. No. 109127171, dated Jul. 21, 2021, 10 pages (with English Search Report).
Office Action in Taiwanese Appln. No. 109127171, dated Dec. 1, 2021, 12 pages (with English translation).
"Banerjee et al., ""Post CMP Aqueous and CO2 Cryogenic Cleaning Technologies for Low k and Copper Integration,"" CMPUG Symposium, Poster Abstract, Jan. 2015, 2 pages".
Sampurno et al, "Pad Surface Thermal Management during Copper Chemical Mechanical Planarization" Presented. Oct. 1, 2015 at lie International Conference on Planarization/CMP Technology, 2015, Sep. 30-Oct. 2, 2015, Session D-4, Chandler, AZ, USA, 24 pages.
Wu et al., "Pad Surface Thermal Management during Copper Chemical: Mechanical. Planarization" ECS Journal of Solid State Science and Technology, Apr. 2015, 4(7):P206-12.
PCT International Search Report and Written Opinion in International Appln. No. PCT/US2020/045771, dated Nov. 25, 2020, 10 pages.
Machine Generated English Translation of CN 207171777, Published on Apr. 3, 2018, 25 pages (CN 207171777 submitted with Information Disclosure Statement on Aug. 26, 2020).
Office Action in Japanese Appln. No. 2022-508503, dated May 30, 2023, 11 pages (with English translation).
Office Action in Chinese Appln. No. 2202080055434.5, dated Jun. 7, 2023, 15 pages (with English translation).

* cited by examiner

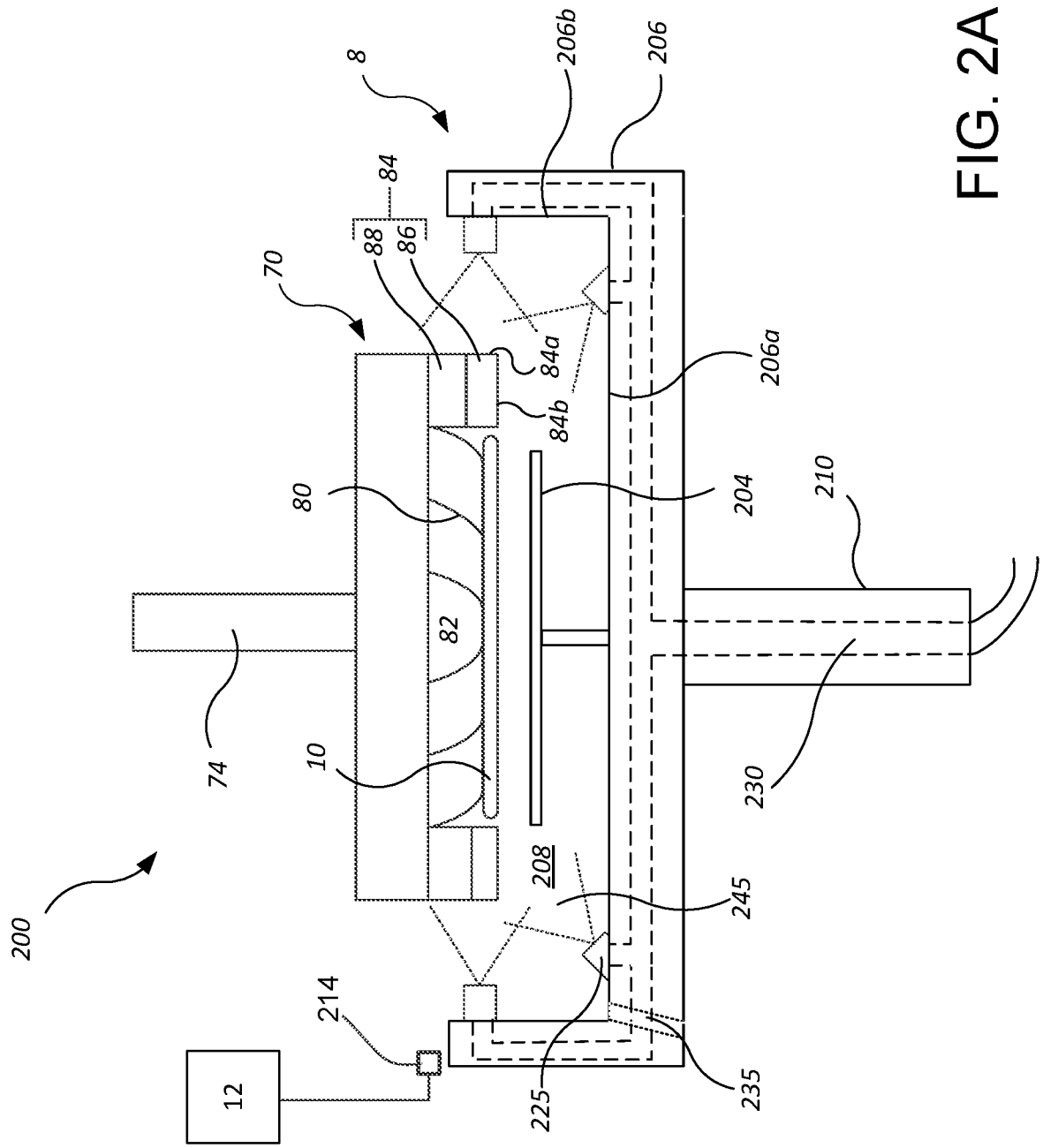

LOW-TEMPERATURE METAL CMP FOR MINIMIZING DISHING AND CORROSION, AND IMPROVING PAD ASPERITY

CROSS-REFERENCE TO RELATED APPLICATIONS

This application claims priority to U.S. Provisional Application Ser. No. 62/886,287, filed on Aug. 13, 2019, the disclosure of which is incorporated by reference.

TECHNICAL FIELD

The present disclosure relates to chemical mechanical polishing (CMP), and more particularly to temperature control during CMP.

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

SUMMARY

In one aspect, a chemical mechanical polishing system includes a platen to support a polishing pad having a polishing surface, a source of coolant, a dispenser having one or more apertures suspended over the platen to direct coolant from the source of coolant onto the polishing surface of the polishing pad; and a controller coupled to the source of coolant and configured to cause the source of coolant to deliver the coolant through the nozzles onto the polishing surface during a selected step of a polishing operation.

Implementations of any of the above aspects may include one or more of the following features.

The source of coolant can include a source of a liquid coolant medium. The source of the liquid coolant medium can include one or more of liquid nitrogen or liquid carbon dioxide.

The source of coolant can include a source of a gas coolant medium. The source of the gas coolant medium can include one or more gas formed from liquid nitrogen or gas formed from liquid carbon dioxide. The source of gas coolant medium can include compressed gas. The source of gas coolant medium can be connected to a vortex tube configured to direct a cold stream of gas onto the polishing pad.

The nozzle can be configured to start and stop fluid flow through the nozzles.

The selected step can be a conditioning step. The selected step can be a metal clearing step. The selected step can be an over-polish step.

In another aspect, a method of chemical mechanical polishing system includes bulk polishing of a substrate with a polishing pad in a first temperature range, and performing one or more of a metal clearing, over-polishing, or conditioning step of the substrate with the polishing pad or conditioning of the polishing pad with a temperature of a polishing surface of the polishing pad lowered to be in a second temperature range that is lower than the first temperature range Implementations of any of the above aspects may include one or more of the following features.

Lowering the temperature can be done using a coolant connected to an arm having one or more nozzles suspended over the polishing surface of the polishing pad, wherein the nozzles on the arm can be configured to direct coolant from the source of coolant onto the polishing surface of the polishing pad to lower the temperature of the polishing surface. The source of coolant can include a source of a liquid coolant medium. The source of the liquid coolant medium can include one or more of liquid nitrogen or liquid carbon dioxide. The source of coolant can include a source of a gas coolant medium. The source of the gas coolant medium can include one or more gas formed from of liquid nitrogen or gas formed from liquid carbon dioxide. The source of gas coolant medium can include compressed gas. The source of gas coolant medium can be connected to a vortex tube configured to direct a cold stream of gas onto the polishing pad.

The nozzle can be configured to start and stop fluid flow through the nozzles.

Possible advantages may include, but are not limited to, one or more of the following.

Controlling the temperature of various components can reduce effects of temperature-dependent processes, such as dishing, erosion, and corrosion. Controlling the temperature can also create more uniform pad asperity, thus improving polishing uniformity, e.g., for clearing metal residues, and extending pad lifetime.

In one example, the temperature of the polishing process is increased. In particular, steam, i.e., gaseous $H_2O$ generated by boiling, can be injected into slurry to transfer energy with low liquid content (i.e., low dilution) to quickly and efficiently raise the temperature of the slurry. This can increase the polishing rate, e.g., during bulk polishing.

In another example, the temperature of the polishing pad surface can be lowered during one or more of the metal clearing, over-polishing, or conditioning steps of a polishing operation. This can reduce dishing and corrosion, and/or improve uniformity of pad asperity, thus improving polishing uniformity and extending the lifetime of the pad.

Additionally, the temperature of various components of the CMP apparatus can be lowered, which can reduce the galvanic reaction rate and reduce corrosion of the various components. This can reduce defects in the polished wafers.

This can improve predictability of polishing during the CMP process, reduce polishing variations from one polishing operation to another polishing operation, and improve wafer-to-wafer uniformity.

The details of one or more implementations are set forth in the accompanying drawings and the description below. Other aspects, features, and advantages will be apparent from the description and drawings, and from the claims.

BRIEF DESCRIPTION OF THE DRAWINGS

FIG. 2A is a schematic cross-sectional view of an example carrier head steam treating assembly.

DETAILED DESCRIPTION

Figure 1:
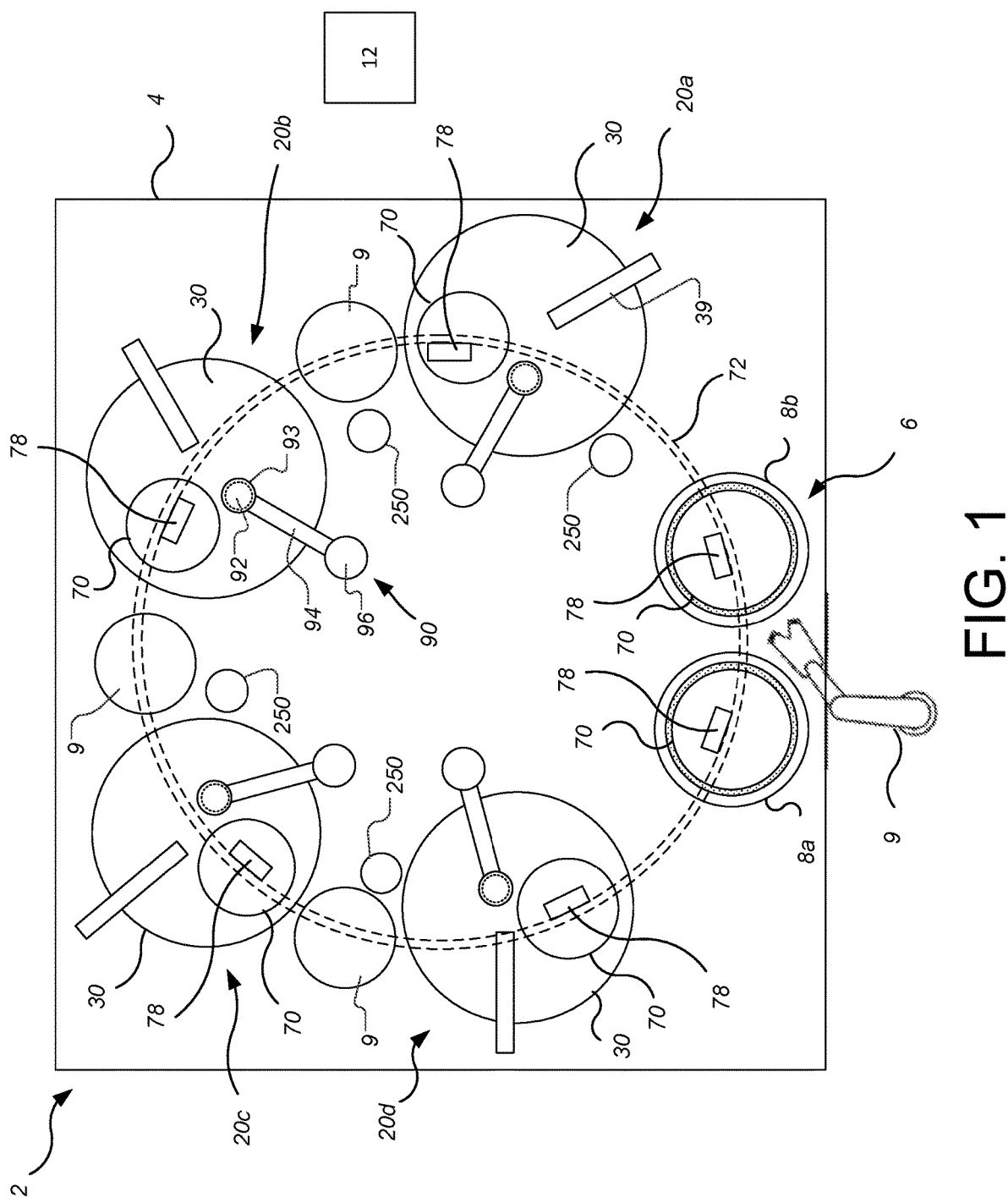
FIG. 1 is a schematic plan view of an example of a polishing apparatus.

Chemical mechanical polishing operates by a combination of mechanical abrasion and chemical etching at the interface between the substrate, polishing liquid, and polishing pad. During the polishing process, a significant amount of heat is generated due to friction between the surface of the substrate and the polishing pad. In addition, some processes also include an in-situ pad conditioning step in which a conditioning disk, e.g., a disk coated with abrasive diamond particles, is pressed against the rotating polishing pad to condition and texture the polishing pad surface. The abrasion of the conditioning process can also generate heat. For example, in a typical one minute copper CMP process with a nominal downforce pressure of 2 psi and removal rate of 8000 Å/min, the surface temperature of a polyurethane polishing pad can rise by about 30° C.

On the other hand, slurry dispensed onto the polishing pad can act as a heat sink. Overall, these effects result in variation of the temperature of the polishing pad spatially and over time.

Both the chemical-related variables in a CMP process, e.g., as the initiation and rates of the participating reactions, and the mechanical-related variables, e.g., the surface friction coefficient, storage modulus, and viscoelasticity of the polishing pad, are strongly temperature dependent. Consequently, variation in the surface temperature of the polishing pad can result in changes in removal rate, polishing uniformity, erosion, dishing, and residue. By more tightly controlling the temperature of the surface of the polishing pad during one or more of metal clearing, over-polish, or conditioning steps, variation in temperature can be reduced, and polishing performance, e.g., as measured by within-wafer non-uniformity or wafer-to-wafer non-uniformity, can be improved.

In general, as the temperature of the polishing liquid 38 increases, the polishing rate of the polishing liquid 38 increases. Conversely, as the temperature of the polishing liquid 38 decreases, the polishing rate of the polishing liquid 38 decreases. An increased polishing rate may be desired at some stages of a polishing operation (e.g., during bulk polishing) and a decreased polishing rate may be desired at other stages of a polishing operation (e.g., during metal clearing, over-polishing, and conditioning steps).

Furthermore, debris and slurry can accumulate on various components of the CMP apparatus during CMP. The mechanical and chemical etching by the debris and the slurry can cause dishing and erosion of the polishing pad, and can corrode various components of the CMP apparatus.

A technique that could address one or more of these issues is to pre-heat the polishing pad and/or slurry during portions of the polishing process, e.g., during bulk polishing. For example, various components of the CMP apparatus (e.g., the polishing liquid 38 from a polishing liquid reservoir) can be heated using steam, i.e., gaseous $H_2O$, to increase the polishing rate during the polishing process. Additionally the temperature of the polishing pad and various components can be lowered, e.g., using vortex tube cooling and/or by dispensing coolants, to reduce the polishing rate of the slurry chemicals during one or more of metal clearing, over-polishing, or conditioning steps.

FIG. 1 is a plan view of a chemical mechanical polishing apparatus 2 for processing one or more substrates. The polishing apparatus 2 includes a polishing platform 4 that at least partially supports and houses a plurality of polishing stations 20. For example, the polishing apparatus can include four polishing stations 20a, 20b, 20c and 20d. Each polishing station 20 is adapted to polish a substrate that is retained in a carrier head 70. Not all components of each station are illustrated in FIG. 1.

The polishing apparatus 2 also includes a multiplicity of carrier heads 70, each of which is configured to carry a substrate. The polishing apparatus 2 also includes a transfer station 6 for loading and unloading substrates from the carrier heads. The transfer station 6 can include a plurality of load cups 8, e.g., two load cups 8a, 8b, adapted to facilitate transfer of a substrate between the carrier heads 70 and a factory interface (not shown) or other device (not shown) by a transfer robot 9. The load cups 8 generally facilitate transfer between the robot 9 and each of the carrier heads 70 by loading and unloading the carrier heads 70.

The stations of the polishing apparatus 2, including the transfer station 6 and the polishing stations 20, can be positioned at substantially equal angular intervals around the center of the platform 4. This is not required, but can provide the polishing apparatus with a good footprint.

For a polishing operation, one carrier head 70 is positioned at each polishing station. Two additional carrier heads can be positioned in the loading and unloading station 6 to exchange polished substrates for unpolished substrates while the other substrates are being polished at the polishing stations 20.

The carrier heads 70 are held by a support structure that can cause each carrier head to move along a path that passes, in order, the first polishing station 20a, the second polishing station 20b, the third polishing station 20c, and the fourth polishing station 20d. This permits each carrier head to be selectively positioned over the polishing stations 20 and the load cups 8.

In some implementations, each carrier head 70 is coupled to a carriage 78 that is mounted to a support structure 72. By moving a carriage 78 along the support structure 72, e.g., a track, the carrier head 70 can be positioned over a selected polishing station 20 or load cup 8. Alternatively, the carrier heads 70 can be suspended from a carousel, and rotation of the carousel moves all of the carrier heads simultaneously along a circular path.

Each polishing station 20 of the polishing apparatus 2 can include a port, e.g., at the end of a slurry dispenser 39 (e.g., a dispenser arm), to dispense polishing liquid 38 (see FIG. 3A), such as abrasive slurry, onto the polishing pad 30. Each polishing station 20 of the polishing apparatus 2 can also include pad conditioner 90 to abrade the polishing pad 30 to maintain the polishing pad 30 in a consistent abrasive state.

Figure 3A:
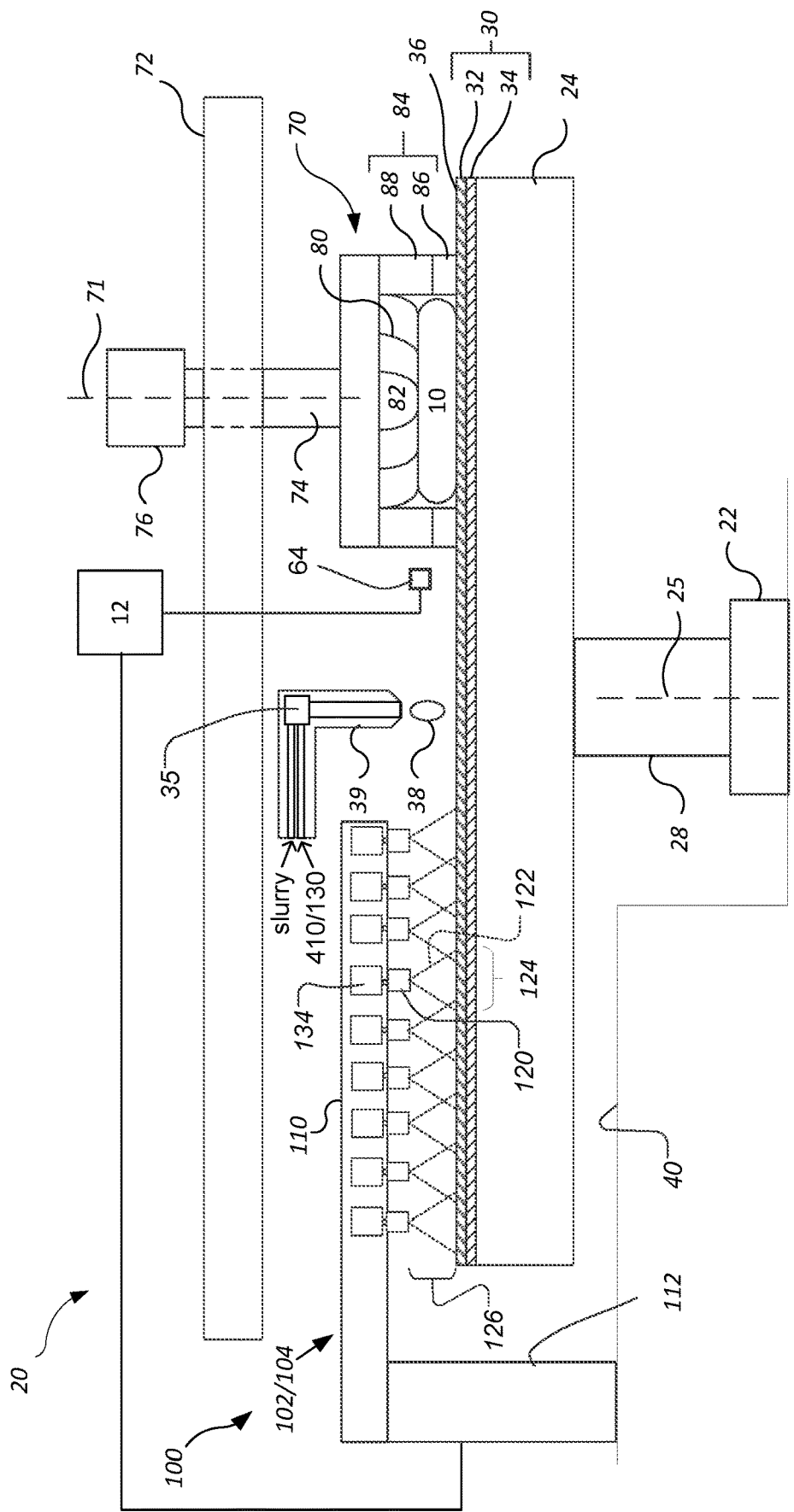
FIG. 3A is a schematic cross-sectional view of an example of a polishing station of the polishing apparatus.
Figure 3B:
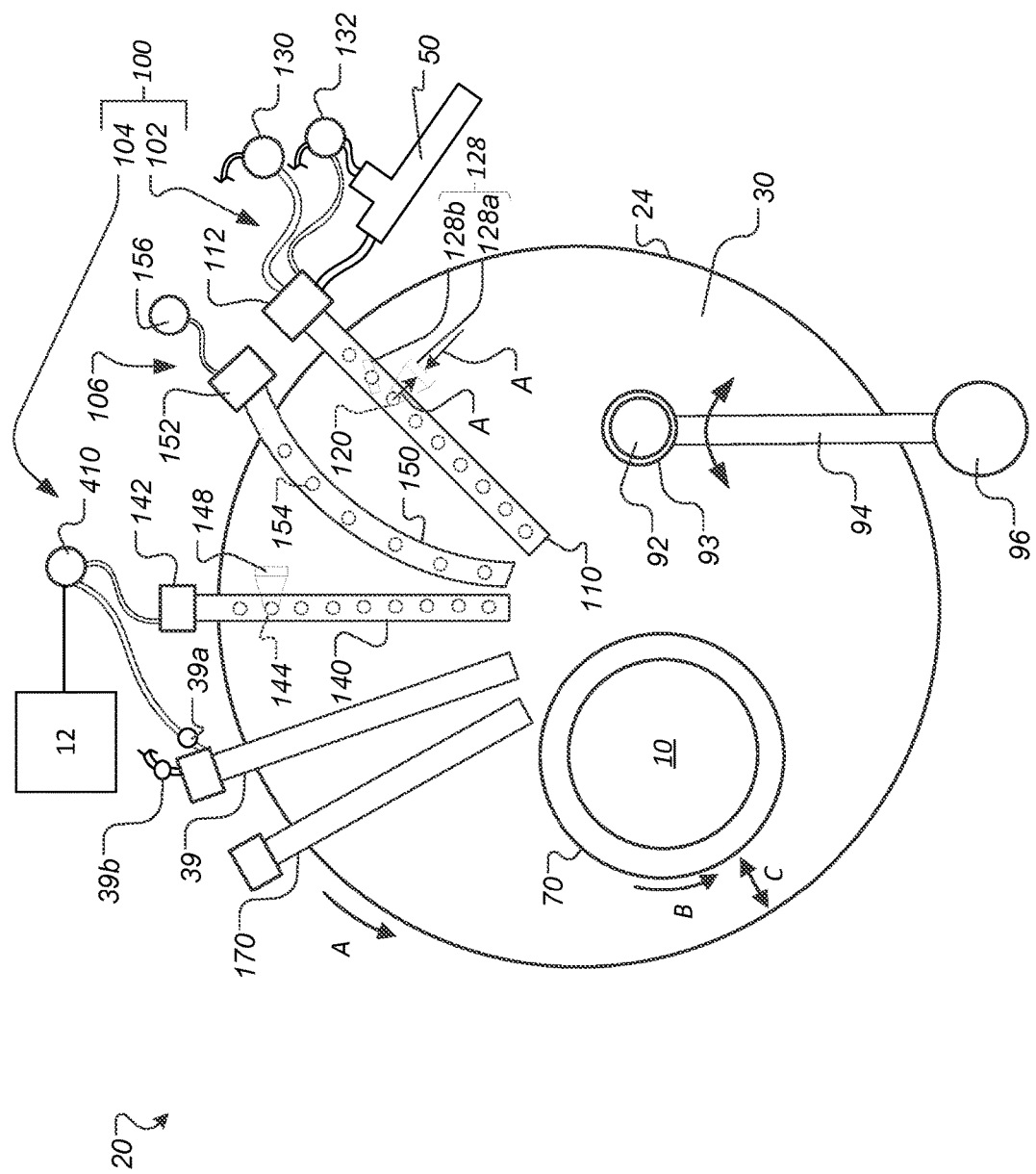
FIG. 3B is a schematic top view of an example polishing station of the chemical mechanical polishing apparatus.

FIGS. 3A and 3B illustrate an example of a polishing station 20 of a chemical mechanical polishing system. The polishing station 20 includes a rotatable disk-shaped platen 24 on which a polishing pad 30 is situated. The platen 24 is operable to rotate (see arrow A in FIG. 3B) about an axis 25. For example, a motor 22 can turn a drive shaft 28 to rotate the platen 24. The polishing pad 30 can be a two-layer polishing pad with an outer polishing layer 32 and a softer backing layer 34.

Referring to FIGS. 1, 3A and 3B, the polishing station 20 can include a supply port, e.g., at the end of a slurry delivery arm 39, to dispense a polishing liquid 38, such as an abrasive slurry, onto the polishing pad 30.

The polishing station 20 can include a pad conditioner 90 with a conditioner disk 92 (see FIG. 2B) to maintain the surface roughness of the polishing pad 30. The conditioner disk 92 can be positioned in a conditioner head 93 at the end of an arm 94. The arm 94 and conditioner head 93 are supported by a base 96. The arm 94 can swing so as to sweep the conditioner head 93 and conditioner disk 92 laterally across the polishing pad 30. A cleaning cup 250 can be located adjacent the platen 24 at a position to which the arm 94 can move the conditioner head 93.

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head 70 can include a retaining ring 84 to hold the substrate. In some implementations, the retaining ring 84 may include a lower plastic portion 86 that contacts the polishing pad, and an upper portion 88 of a harder material, e.g., a metal.

In operation, the platen is rotated about its central axis 25, and the carrier head is rotated about its central axis 71 (see arrow B in FIG. 3B) and translated laterally (see arrow C in FIG. 3B) across the top surface of the polishing pad 30.

Referring to FIGS. 3A and 3B, as the carrier head 70 sweeps across the polishing pad 30, any exposed surfaces of the carrier head 70 tend to become covered with slurry. For example, slurry can stick to the outer or inner diameter surface of the retaining ring 84. In general, for any surfaces that are not maintained in a wet condition, the slurry will tend to coagulate and/or dry out. As a result, particulates can form on the carrier head 70. If these particulates become dislodged, the particulates can scratch the substrate, resulting in polishing defects.

Moreover, the slurry can cake onto the carrier head 70, or the sodium hydroxide in the slurry can crystallize on one of the surfaces of the carrier head 70 and/or the substrate 10 and cause the surface of the carrier head 70 to be corrode. The caked-on slurry is difficult to remove and the crystallized sodium hydroxide is difficult to return to a solution.

Similar problems occur with the conditioner head 93, e.g., particulates can form on the conditioner head 93, the slurry can cake onto the conditioner head 93, or the sodium hydroxide in the slurry can crystallize on one of the surfaces of the conditioner head 93.

One solution is to clean the components, e.g., the carrier head 70 and conditioner head 93, with a liquid water jet. However, the components can be difficult to clean with a water jet alone, and a substantial amount of water may be necessary. Additionally, the components that contact the polishing pad 30, e.g., the carrier head 70, substrate 10 and conditioner disk 92, can act as heat sinks that hinder uniformity of the polishing pad temperature.

To address these problems, as shown in the FIG. 2A, the polishing apparatus 2 includes one or more carrier head steam treating assemblies 200. Each steam treating assembly 200 can be used for cleaning and/or pre-heating of the carrier head 70 and substrate 10.

A steam treating assembly 200 can be part of the load cup 8, e.g., part of the load cup 8a or 8b. Alternatively or in addition, a steam treating assembly 200 can be provided at one or more inter-platen stations 9 located between adjacent polishing stations 20.

The load cup 8 includes a pedestal 204 to hold the substrate 10 during a loading/unloading process. The load cup 8 also includes a housing 206 that surrounds or substantially surrounds the pedestal 204. Multiple nozzles 225 are supported by the housing 206 or a separate support to deliver steam 245 to a carrier head and/or substrate positioned in a cavity 208 defined by the housing 206. For example, nozzles 225 can be positioned on one or more interior surfaces of the housing 206, e.g., a floor 206a and/or a side wall 206b and/or a ceiling of the cavity. The nozzles 225 can be configured to start and stop fluid flow through the nozzles 225, e.g., using the controller 12. The nozzles 225 can be oriented to direct steam inwardly into the cavity 206. The steam 245 can be generated by using the steam generator 410, e.g., a steam generator discussed further below. A drain 235 can permit excess water, cleaning solution, and cleaning by-product to pass through to prevent accumulation in the load cup 8.

An actuator provides relative vertical motion between the housing 206 and the carrier head 70. For example, a shaft 210 can support the housing 206 and be vertically actuatable to raise and lower the housing 206. Alternatively, the carrier head 70 can move vertically. The pedestal 204 can be on-axis with the shaft 210. The pedestal 204 can be vertically movable relative to the housing 206.

In operation, the carrier head 70 can be positioned over the load cup 8, and the housing 206 can be raised (or the carrier head 70 lowered) so that the carrier head 70 is partially within the cavity 208. A substrate 10 can begin on the pedestal 204 and be chucked onto the carrier head 70, and/or begin on the carrier head 70 and be dechucked onto the pedestal 204.

Steam is directed through the nozzles 225 to clean and/or preheat one or more surfaces of the substrate 10 and/or carrier head 70. For example, one or more of the nozzles can be positioned to direct steam onto the outer surface of the carrier head 70, the outer surface 84a of the retaining ring 84, and/or the bottom surface 84b of the retaining ring 84. One or more of the nozzles can be positioned to direct steam onto a front surface of a substrate 10 being held by the carrier head 70, i.e., the surface to be polished, or onto the bottom surface of the membrane 80 if no substrate 10 is being supported on the carrier head 70. One or more nozzles can be positioned below the pedestal 204 to direct steam upward onto the front surface of a substrate 10 positioned on pedestal 204. One or more nozzles can be positioned above the pedestal 204 to direct steam downward onto a back surface of a substrate 10 positioned on pedestal 204. The carrier head 70 can rotate within the load cup 8 and/or move vertically relative to the load cup 8 to allow the nozzles 225 to treat different areas of the carrier head 70 and/or substrate 10. The substrate 10 can rest on the pedestal 204 to allow for the interior surfaces of the carrier head 70 to be steam treated, e.g., the bottom surface of the membrane 82, or the inner surfaces of the retaining ring 84.

Steam is circulated from a steam source through a supply line 230 through the housing 206 to the nozzles 225. The nozzles 225 can spray steam 245 to remove organic residues, by-product, debris, and slurry particles left on the carrier head 70 and the substrate 10 after each polishing operation. The nozzles 225 can spray steam 245 to heat the substrate 10 and/or carrier head 70.

An inter-platen station 9 can be constructed and operated similarly, but need not have a substrate support pedestal.

The steam 245 delivered by the nozzles 225 can have an adjustable temperature, pressure, and flow rate to vary the cleaning and preheating of the carrier head 70 and the substrate 10. In some implementations, the temperature, pressure and/or flow rate can be independently adjustable for each nozzle or between groups of nozzles.

Figure 4A:
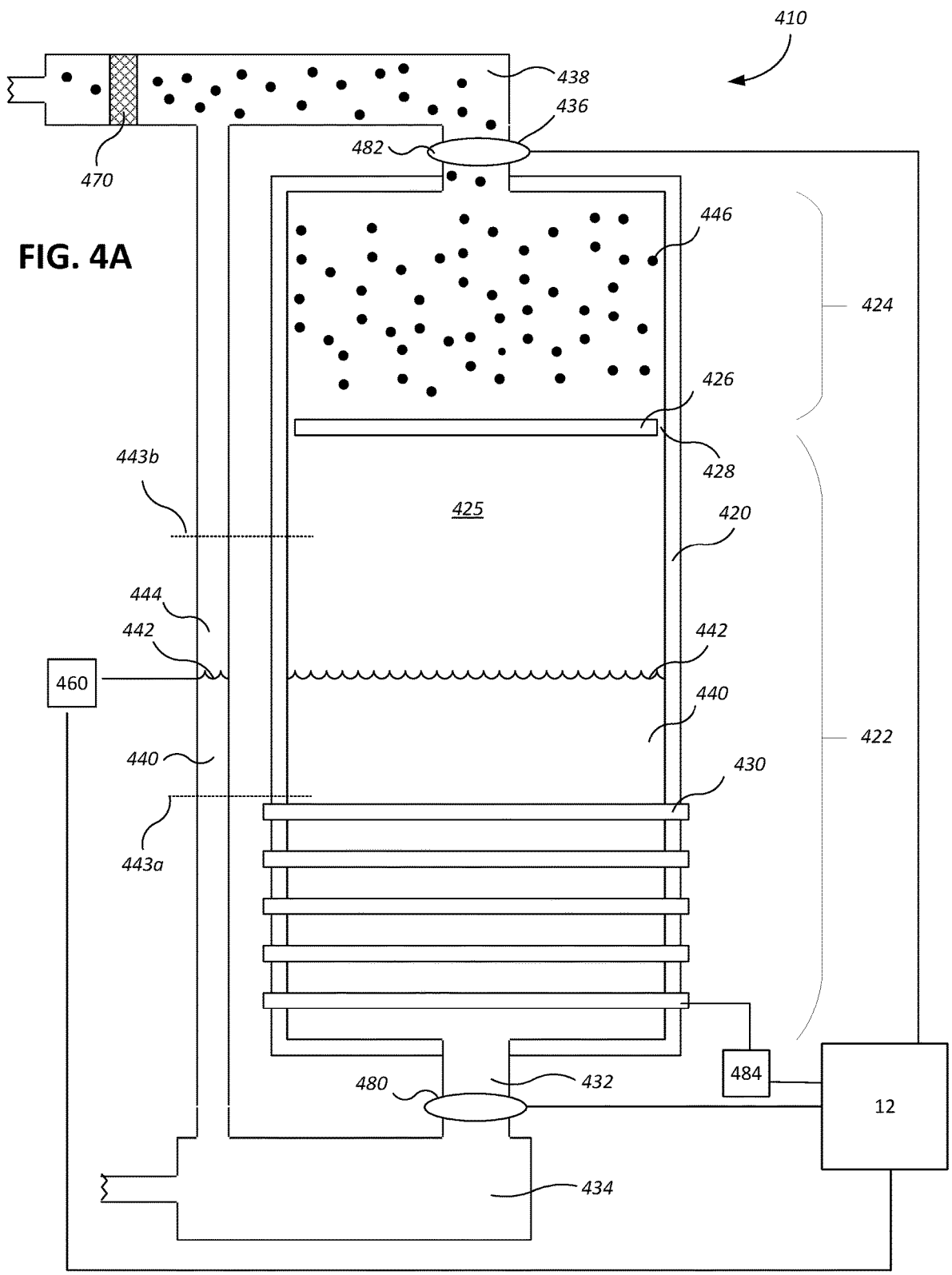
FIG. 4A is a schematic cross-sectional view of an example steam generator.

For example, the temperature of the steam 245 can be 90 to 200° C. when the steam 245 is generated (e.g., in the steam generator 410 in FIG. 4A). The temperature of the steam 245 can be between 90 to 150° C. when the steam 245 is dispensed by the nozzles 225, e.g., due to heat loss in transit. In some implementations, steam is delivered by the nozzles 225 at a temperature of 70-100° C., e.g., 80-90° C. In some implementations, the steam delivered by the nozzles is superheated, i.e., is at a temperature above the boiling point.

The flow rate of the steam 245 can be 1-1000 cc/minute when the steam 245 is delivered by the nozzles 225, depending on heater power and pressure. In some implementations, the steam is mixed with other gases, e.g., is mixed with normal atmosphere or with $N_2$. Alternatively, the fluid delivered by the nozzles 225 is substantially purely water. In some implementations, the steam 245 delivered by the nozzles 225 is mixed with liquid water, e.g., aerosolized water. For example, liquid water and steam can be combined at a relative flow ratio (e.g., with flow rates in sccm) 1:1 to 1:10. However, if the amount of liquid water is low, e.g., less than 5 wt %, e.g., less than 3 wt %, e.g., less than 1 wt %, then the steam will have superior heat transfer qualities. Thus, in some implementations the steam is dry steam, i.e., is substantially free of water droplets.

To avoid degrading the membrane with heat, water can be mixed with the steam 245 to reduce the temperature, e.g., to around 40-50° C. The temperature of the steam 245 can be reduced by mixing cooled water into the steam 245, or mixing water at the same or substantially the same temperature into the steam 245 (as liquid water transfers less energy than gaseous water).

In some implementations, a temperature sensor 214 can be installed in or adjacent the steam treating assembly 200 to detect the temperature of the carrier head 70 and/or the substrate 10. A signal from the sensor 214 can be received by a controller 12 to monitor the temperature of the carrier head 70 and/or the substrate 10. The controller 12 can control delivery of the steam by the assembly 100 based on the temperature measurement from the temperature sensor 214. For example, the controller can receive a target temperature value. If the controller 12 detects that the temperature measurement exceeds a target value, the controller 12 halt the flow of steam. As another example, the controller 12 can reduce the steam delivery flow rate and/or reduce the steam temperature, e.g., to prevent overheating of the components during cleaning and/or preheating.

In some implementations, the controller 12 includes a timer. In this case, the controller 12 can start when delivery of the steam begins, and can halt delivery of steam upon expiration of the timer. The timer can be set based on empirical testing to attain a desired temperature of the carrier head 70 and substrate 10 during cleaning and/or preheating.

Figure 2B:
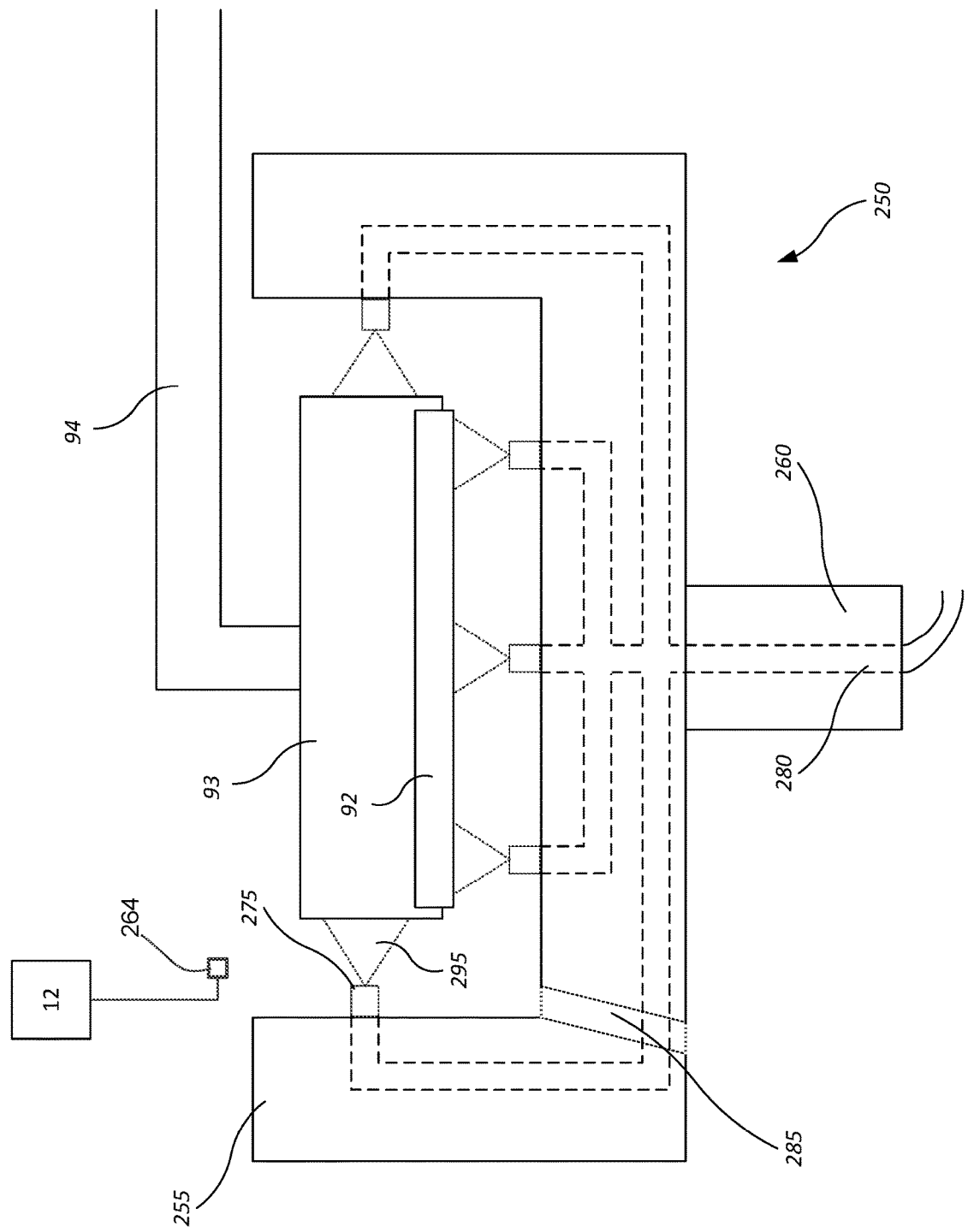
FIG. 2B is a schematic cross-sectional view of an example conditioning head steam treating assembly.

FIG. 2B shows a conditioner steam treating assembly 250 that includes a housing 255. The housing 255 can form of a "cup" to receive the conditioner disk 92 and conditioner head 93. Steam is circulated through a supply line 280 in the housing 255 to one or more nozzles 275. The nozzles 275 can spray steam 295 to remove polishing by-product, e.g., debris or slurry particles, left on the conditioner disk 92 and/or conditioner head 93 after each conditioning operation. The nozzles 275 can be located in the housing 255, e.g., on a floor, side wall, or ceiling of an interior of the housing 255. The nozzles 275 can be configured to start and stop fluid flow through the nozzles 275, e.g., using the controller 12. One or more nozzles can be positioned to clean the bottom surface of the pad conditioner disk, and/or the bottom surface, side-walls and/or top surface of the conditioner head 93. The steam 295 can be generated using the steam generator 410. A drain 285 can permit excess water, cleaning solution, and cleaning by-product to pass through to prevent accumulation in the housing 255.

The conditioner head 93 and conditioner disk 92 can be lowered at least partially into the housing 255 to be steam treated. When the conditioner disk 92 is to be returned to operation, the conditioner head 93 and conditioning disk 92 are lifted out of the housing 255 and positioned on the polishing pad 30 to condition the polishing pad 30. When the conditioning operation is completed, the conditioner head 93 and conditioning disk 92 are lifted off the polishing pad and swung back to the housing 255 for the polishing by-product on the conditioner head 93 and conditioner disk 92 to be removed. In some implementations, the housing 255 is vertical actuatable, e.g., is mounted to a vertical drive shaft 260.

The housing 255 is positioned to receive the pad conditioner disk 92 and conditioner head 93. The conditioner disk 92 and conditioner head 93 can rotate within the housing 255, and/or move vertically in the housing 255, to allow the nozzles 275 to steam treat the various surfaces of the conditioning disk 92 and conditioner head 93.

The steam 295 delivered by the nozzles 275 can have an adjustable temperature, pressure, and/or flow rate. In some implementations, the temperature, pressure and/or flow rate can be independently adjustable for each nozzle or between groups of nozzles. This permits variation and thus more effective the cleaning of the conditioner disk 92 or conditioner head 93.

For example, the temperature of the steam 295 can be 90 to 200° C. when the steam 295 is generated (e.g., in the steam generator 410 in FIG. 4A). The temperature of the steam 295 can be between 90 to 150° C. when the steam 295 is dispensed by the nozzles 275, e.g., due to heat loss in transit. In some implementations, steam can be delivered by the nozzles 275 at a temperature of 70-100° C., e.g., 80-90° C. In some implementations, the steam delivered by the nozzles is superheated, i.e., is at a temperature above the boiling point.

The flow rate of the steam 295 can be 1-1000 cc/minute when the steam 295 is delivered by the nozzles 275. In some implementations, the steam is mixed with other gases, e.g., is mixed with normal atmosphere or with $N_2$. Alternatively, the fluid delivered by the nozzles 275 is substantially purely water. In some implementations, the steam 295 delivered by the nozzles 275 is mixed with liquid water, e.g., aerosolized water. For example, liquid water and steam can be combined at a relative flow ratio (e.g., with flow rates in sccm) 1:1 to 1:10. However, if the amount of liquid water is low, e.g., less than 5 wt %, e.g., less than 3 wt %, e.g., less than 1 wt %, then the steam will have superior heat transfer qualities. Thus, in some implementations the steam is dry steam, i.e., does not include water droplets.

In some implementations, a temperature sensor 264 can be installed in or adjacent the housing 255 to detect the temperature of the conditioner head 93 and/or conditioner disk 92. The controller 12 can receive a signal from the temperature sensor 264 to monitor the temperature of the conditioner head 93 or conditioner disk 92, e.g., to detect the temperature of the pad conditioner disk 92. The controller 12 can control delivery of the steam by the assembly 250 based on the temperature measurement from the temperature sensor 264. For example, the controller can receive a target temperature value. If the controller 12 detects that the temperature measurement exceeds a target value, the controller 12 halt the flow of steam. As another example, the controller 12 can reduce the steam delivery flow rate and/or reduce the steam temperature, e.g., to prevent overheating of the components during cleaning and/or preheating.

In some implementations, the controller 12 uses a timer. In this case, the controller 12 can start the time when delivery of steam begins, and halt delivery of steam upon expiration of the timer. The timer can be set based on empirical testing to attain a desired temperature of the conditioner disk 92 during cleaning and/or preheating, e.g., to prevent overheating.

Referring to FIG. 3A, in some implementations, the polishing station 20 includes a temperature sensor 64 to monitor a temperature in the polishing station or a component of/in the polishing station, e.g., the temperature of the polishing pad 30 and/or polishing liquid 38 on the polishing pad. For example, the temperature sensor 64 could be an infrared (IR) sensor, e.g., an IR camera, positioned above the polishing pad 30 and configured to measure the temperature of the polishing pad 30 and/or polishing liquid 38 on the polishing pad. In particular, the temperature sensor 64 can be configured to measure the temperature at multiple points along the radius of the polishing pad 30 in order to generate a radial temperature profile. For example, the IR camera can have a field of view that spans the radius of the polishing pad 30.

In some implementations, the temperature sensor is a contact sensor rather than a non-contact sensor. For example, the temperature sensor 64 can be thermocouple or IR thermometer positioned on or in the platen 24. In addition, the temperature sensor 64 can be in direct contact with the polishing pad.

In some implementations, multiple temperature sensors could be spaced at different radial positions across the polishing pad 30 in order to provide the temperature at multiple points along the radius of the polishing pad 30. This technique could be used in the alternative or in addition to an IR camera.

Although illustrated in FIG. 3A as positioned to monitor the temperature of the polishing pad 30 and/or polishing liquid 38 on the pad 30, the temperature sensor 64 could be positioned inside the carrier head 70 to measure the temperature of the substrate 10. The temperature sensor 64 can be in direct contact (i.e., a contacting sensor) with the semiconductor wafer of the substrate 10. In some implementations, multiple temperature sensors are included in the polishing station 20, e.g., to measure temperatures of different components of/in the polishing station.

The polishing station 20 also includes a temperature control system 100 to control the temperature of the polishing pad 30 and/or polishing liquid 38 on the polishing pad. The temperature control system 100 can include a cooling system 102 and/or a heating system 104. At least one, and in some implementations both, of the cooling system 102 and heating system 104 operate by delivering a temperature-controlled medium, e.g., a liquid, vapor or spray, onto the polishing surface 36 of the polishing pad 30 (or onto a polishing liquid that is already present on the polishing pad).

For the cooling system 102, the cooling medium can be a gas, e.g., air, or a liquid, e.g., water. The medium can be at room temperature or chilled below room temperature, e.g., at 5-15° C. In some implementations, the cooling system 102 uses a spray of air and liquid, e.g., an aerosolized spray of liquid, e.g., water. In particular, the cooling system can have nozzles that generate an aerosolized spray of water that is chilled below room temperature. In some implementations, solid material can be mixed with the gas and/or liquid. The solid material can be a chilled material, e.g., ice, or a material that absorbs heat, e.g., by chemical reaction, when dissolved in water.

The cooling medium can be delivered by flowing through one or more apertures, e.g., holes or slots, optionally formed in nozzles, in a coolant delivery arm. The apertures can be provided by a manifold that is connected to a coolant source.

As shown in FIGS. 3A and 3B, an example cooling system 102 includes an arm 110 that extends over the platen 24 and polishing pad 30 from an edge of the polishing pad to or at least near (e.g., within 5% of the total radius of the polishing pad) the center of polishing pad 30. The arm 110 can be supported by a base 112, and the base 112 can be supported on the same frame 40 as the platen 24. The base 112 can include one or more an actuators, e.g., a linear actuator to raise or lower the arm 110, and/or a rotational actuator to swing the arm 110 laterally over the platen 24. The arm 110 is positioned to avoid colliding with other hardware components such as the polishing head 70, pad conditioning disk 92, and the slurry dispenser 39.

The example cooling system 102 includes multiple nozzles 120 suspended from the arm 110. Each nozzle 120 is configured to spray a liquid coolant medium, e.g., water, onto the polishing pad 30. The arm 110 can be supported by a base 112 so that the nozzles 120 are separated from the polishing pad 30 by a gap 126. Each nozzle 120 can be configured to start and stop fluid flow through each nozzle 120, e.g., using the controller 12. Each nozzle 120 can be configured to direct aerosolized water in a spray 122 toward the polishing pad 30.

The cooling system 102 can include a source 130 of liquid coolant medium and a source 132 of gas coolant medium (see FIG. 3B). Liquid from the source 130 and gas from the source 132 can be mixed in a mixing chamber 134 (see FIG. 3A), e.g., in or on the arm 110, before being directed through the nozzle 120 to form the spray 122. When dispensed, this coolant can be below room temperature, e.g., from −100 to 20° C., e.g., below 0° C.

The coolants used in the cooling system 102 can include, for example, liquid nitrogen, or gas formed from liquid nitrogen and/or dry ice. In some implementations, droplets of water can be added to gas flow. The water can be cooled to form ice droplets that efficiently cool the polishing pad due to the latent heat of fusion of the ice droplets. Additionally, the ice or water droplets can prevent the polishing pad 30 from drying out as it is being cooled by the cooled gas. Rather than water, ethanol or isopropyl alcohol can injected into the gas flow to form frozen particles.

Gas, e.g., compressed gas, from the gas source 132 can be connected to a vortex tube 50 that can separate the compressed gas into a cold stream and a hot stream, and direct the cold stream to the nozzles 120 onto the polishing pad 30. In some implementations, the nozzles 120 are the lower ends of vortex tubes that direct a cold stream of compressed gas onto the polishing pad 30.

In some implementations, a process parameter, e.g., flow rate, pressure, temperature, and/or mixing ratio of liquid to gas, can be independently controlled for each nozzle (e.g., by the controller 12). For example, the coolant for each nozzle 120 can flow through an independently controllable chiller to independently control the temperature of the spray. As another example, a separate pair of pumps, one for the gas and one for the liquid, can be connected to each nozzle such that the flow rate, pressure and mixing ratio of the gas and liquid can be independently controlled for each nozzle.

The various nozzles can spray onto different radial zones 124 on the polishing pad 30. Adjacent radial zones 124 can overlap. In some implementations, the nozzles 120 generate a spray impinges the polishing pad 30 along an elongated region 128. For example, the nozzle can be configured to generate a spray in a generally planar triangular volume.

One or more of the elongated region 128, e.g., all of the elongated regions 128, can have a longitudinal axis parallel to the radius that extends through the region 128 (see region 128a). Alternatively, the nozzles 120 generate a conical spray.

Although FIG. 1 illustrates the spray itself overlapping, the nozzles 120 can be oriented so that the elongated regions do not overlap. For example, at least some nozzles 120, e.g., all of the nozzles 120, can be oriented so that the elongated region 128 is at an oblique angle relative to the radius that passes through the elongated region (see region 128b).

At least some nozzles 120 can be oriented so that a central axis of the spray (see arrow A) from that nozzle is at an oblique angle relative to the polishing surface 36. In particular, spray 122 can be directed from a nozzle 120 to have a horizontal component in a direction opposite to the direction of motion of polishing pad 30 (see arrow A) in the region of impingement caused by rotation of the platen 24.

Although FIGS. 3A and 3B illustrate the nozzles 120 as spaced at uniform intervals, this is not required. The nozzles 120 could be distributed non-uniformly either radially, or angularly, or both. For example, the nozzles 120 can clustered more densely along the radial direction toward the edge of the polishing pad 30. In addition, although FIGS. 3A and 3B illustrate nine nozzles, there could be a larger or smaller number of nozzles, e.g., three to twenty nozzles.

The cooling system 102 can be used to lower the temperature of the polishing surface 36. For example, the temperature of the polishing surface 36 can be lowered using liquid from the liquid coolant source 130 via the spray 122, gas from the gas coolant source 132 via the spray 122, the cold stream from the vortex tube 50, or a combination thereof. In some embodiments, the temperature of the polishing surface 36 can be lowered to at or below 20° C. Lower temperatures during one or more of metal clearing overpolishing, or conditioning steps can reduce dishing and erosion of the soft metals during CMP by reducing the selectivity of the polishing liquid 38.

In some implementations, a temperature sensor measures the temperature of the polishing pad or polishing liquid on the polishing pad, and a controller executes a closed loop control algorithm to control the flow rate of the coolant relative to the flow rate of the polishing liquid so as to maintain the polishing pad or polishing liquid on the polishing pad at a desired temperature.

Lower temperatures during CMP can be used to reduce corrosion. For example, lower temperatures during one or more of metal clearing, over-polishing, or conditioning steps could reduce galvanic corrosion in the various components, as galvanic reactions can be temperature-dependent. Additionally, during CMP the vortex tube 50 can use gases that are inert in the polishing process. In particular, a gas that lacks oxygen (or has lower oxygen than normal atmosphere) can be used to create a localized inert environment that reduces the oxygen in the localized inert environment, which can result in reduced corrosion. Examples of such gasses include nitrogen and carbon dioxide, e.g., evaporated from liquid nitrogen or dry ice.

Lowering the temperature of the polishing surface 36, e.g., for the conditioning step, can increase the storage modulus of the polishing pad 30 and reduce the viscoelasticity of the polishing pad 30. The increased storage modulus and reduced viscoelasticity, combined with a lower downforce on the pad conditioning disk 92 and/or less aggressive conditioning by the pad conditioning disk 92, can result in a more uniform pad asperity. An advantage to the uniform pad asperity is to reduce scratches on the substrate 10 during subsequent polishing operations, as well as increase the lifespan of the polishing pad 30.

In some implementations, instead of or in addition to using a coolant to lower the temperature of the polishing liquid, a heated fluid, e.g., steam, can be injected into the polishing liquid 38 (e.g., slurry) to raise the temperature of the polishing liquid 38 before the polishing liquid 38 is dispensed. Alternatively, the heated fluid, e.g., steam can be directed onto the polishing pad, i.e., so that the temperature of the polishing liquid is adjusted after it is dispensed.

For the heating system 104, the heating fluid can be a gas, e.g., steam (e.g., from the steam generator 410, see FIG. 4A) or heated air, or a liquid, e.g., heated water, or a combination of gas and liquid. The heating fluid is above room temperature, e.g., at 40-120° C., e.g., at 90-110° C. The fluid can be water, such as substantially pure de-ionized water, or water that includes additives or chemicals. In some implementations, the heating system 104 uses a spray of steam. The steam can includes additives or chemicals.

The heating fluid can be delivered by flowing through apertures, e.g., holes or slots, e.g., provided by one or more nozzles, on a heating delivery arm. The apertures can be provided by a manifold that is connected to a source of the heating fluid.

An example heating system 104 includes an arm 140 that extends over the platen 24 and polishing pad 30 from an edge of the polishing pad to or at least near (e.g., within 5% of the total radius of the polishing pad) the center of polishing pad 30. The arm 140 can be supported by a base 142, and the base 142 can be supported on the same frame 40 as the platen 24. The base 142 can include one or more an actuators, e.g., a linear actuator to raise or lower the arm 140, and/or a rotational actuator to swing the arm 140 laterally over the platen 24. The arm 140 is positioned to avoid colliding with other hardware components such as the polishing head 70, pad conditioning disk 92, and the slurry dispenser 39.

Along the direction of rotation of the platen 24, the arm 140 of the heating system 104 can be positioned between the arm 110 of the cooling system 102 and the carrier head 70. Along the direction of rotation of the platen 24, the arm 140 of the heating system 104 can be positioned between the arm 110 of the cooling system 102 and the slurry dispenser 39. For example, the arm 110 of the cooling system 102, the arm 140 of the heating system 104, the slurry dispenser 39 and the carrier head 70 can be positioned in that order along the direction of rotation of the platen 24.

Multiple openings 144 are formed in the bottom surface of the arm 140. Each opening 144 is configured to direct a gas or vapor, e.g., steam, onto the polishing pad 30. The arm 140 can be supported by a base 142 so that the openings 144 are separated from the polishing pad 30 by a gap. The gap can be 0.5 to 5 mm. In particular, the gap can be selected such that the heat of the heating fluid does not significantly dissipate before the fluid reaches the polishing pad. For example, the gap can be selected such that steam emitted from the openings does not condense before reaching the polishing pad.

The heating system 104 can include a source 148 of steam, e.g., the steam generator 410 (see FIG. 4A), which can be connected to the arm 140 by tubing. Each opening 144 can be configured to direct steam toward the polishing pad 30.

In some implementations, a process parameter, e.g., flow rate, pressure, temperature, and/or mixing ratio of liquid to gas, can be independently controlled for each nozzle. For example, the fluid for each opening 144 can flow through an independently controllable heater to independently control the temperature of the heating fluid, e.g., the temperature of the steam.

The various openings 144 can direct steam onto different radial zones on the polishing pad 30. Adjacent radial zones can overlap. Optionally, some of the openings 144 can be oriented so that a central axis of the spray from that opening is at an oblique angle relative to the polishing surface 36. Steam can be directed from one or more of the openings 144 to have a horizontal component in a direction opposite to the direction of motion of polishing pad 30 in the region of impingement as caused by rotation of the platen 24.

Although FIG. 3B illustrates the openings 144 as spaced at even intervals, this is not required. The nozzles 120 could be distributed non-uniformly either radially, or angularly, or both. For example, openings 144 could be clustered more densely toward the center of the polishing pad 30. As another example, openings 144 could be clustered more densely at a radius corresponding to a radius at which the polishing liquid 38 is delivered to the polishing pad 30 by the slurry dispenser 39. In addition, although FIG. 3B illustrates nine openings, there could be a larger or smaller number of openings.

Referring to FIGS. 3A and 3B, the steam 245 from the steam generator 410 (see FIG. 4A) can be injected into the polishing liquid 38 (e.g., slurry) and raise the temperature of the polishing liquid 38 before the polishing liquid 38 is dispensed. An advantage to using steam 245 to heat the polishing liquid 38, instead of using liquid water, is that a smaller amount of steam 245 would need to be injected into the polishing liquid 38, as the latent heat of vaporization allows for greater energy transfer from steam as compared to liquid water. Also, because less steam 245 is required than liquid water to raise the temperature of the polishing liquid 38, the polishing liquid 38 does not become too diluted. Steam can be injected into the polishing liquid at a flow ratio of 1:100 to 1:5. For example, a small amount of steam 245, e.g., 1 cc of steam 245 (at 1 atm) per 50 cc of polishing liquid 38, can be used to heat the polishing liquid 38.

The steam 245 and the polishing liquid 38 can be mixed in a mixing chamber 35 located within the arm of the slurry dispenser 39. The heating fluid, e.g., the steam 245, can also be used to heat the slurry dispenser 39 and/or the polishing liquid reservoir which in turn can heat the polishing liquid 38 prior to dispensing onto the polishing pad 30.

The steam 245 can similarly be used to heat up other liquids used in CMP such as deionized water and other chemicals (e.g., cleaning chemicals). In some embodiments, these liquids can be mixed with the polishing liquid 38 before being dispensed by the slurry dispenser 39. The increased temperature can increase the chemical etching rate of the polishing liquid 38, improving its efficiency and requiring less polishing liquid 38 during the polishing operation.

In some implementations, a temperature sensor measures the temperature of the mixture, and a controller executes a closed loop control algorithm to control the flow rate of the steam relative to the flow rate of the polishing liquid so as to maintain the mixture at a desired temperature.

In some implementations, a temperature sensor measures the temperature of the polishing pad or slurry on the polishing pad, and a controller executes a closed loop control algorithm to control the flow rate of the steam relative to the flow rate of the polishing liquid so as to maintain the polishing pad or slurry on the polishing pad at a desired temperature.

The controller 12 can control the flow of steam 245 through a nozzle or valve (e.g., a steam valve) (not illustrated) located between the steam generator 410 and the slurry dispenser 39, and the controller 12 can control the flow of polishing liquid 38 through a nozzle or valve (e.g., a polishing liquid valve) (not illustrated) located between the polishing liquid reservoir and the slurry dispenser 39.

The steam 245 and the polishing liquid 38 can be mixed in a mixing chamber 35 located within the arm of the slurry dispenser 39. The heating fluid, e.g., the steam 245, can also be used to heat the slurry dispenser 39 and/or the polishing liquid reservoir which in turn can heat the polishing liquid 38 prior to dispensing onto the polishing pad 30

The steam 245 can similarly be used to heat up other liquids used in CMP such as deionized water and other chemicals (e.g., cleaning chemicals). In some embodiments, these liquids can be mixed with the polishing liquid 38 before being dispensed by the slurry dispenser 39. The increased temperature can increase the chemical etching rate of the polishing liquid 38, improving its efficiency and requiring less polishing liquid 38 during the polishing operation.

The polishing system 20 can also include a high pressure rinse system 106. The high pressure rinse system 106 includes a plurality of nozzles 154, e.g., three to twenty nozzles that direct a cleaning fluid, e.g., water, at high intensity onto the polishing pad 30 to wash the pad 30 and remove used slurry, polishing debris, etc.

As shown in FIG. 3B, an example high pressure rinse system 106 includes an arm 150 that extends over the platen 24 and polishing pad 30 from an edge of the polishing pad to or at least near (e.g., within 5% of the total radius of the polishing pad) the center of the polishing pad 30. The arm 150 can be supported by a base 152, and the base 152 can be supported on the same frame 40 as the platen 24. The base 152 can include one or more an actuators, e.g., a linear actuator to raise or lower the arm 150, and/or a rotational actuator to swing the arm 150 laterally over the platen 24. The arm 150 is positioned to avoid colliding with other hardware components such as the polishing head 70, pad conditioning disk 92, and the slurry dispenser 39.

Along the direction of rotation of the platen 24, the arm 150 of the rinse system 106 can be between the arm 110 of the cooling system 102 and the arm 140 of the heating system 102. For example, the arm 110 of the cooling system 102, the arm 150 of the rinse system 106, the arm 140 of the heating system 104, the slurry dispenser 39 and the carrier head 70 can be positioned in that order along the direction of rotation of the platen 24. Alternatively, along the direction of rotation of the platen 24, the arm 110 of the cooling system 102 can be between the arm 150 of the rinse system 106 and the arm 140 of the heating system 104. For example, the arm 150 of the rinse system 106, the arm 110 of the cooling system 102, the arm 140 of the heating system 104, the slurry dispenser 39 and the carrier head 70 can be positioned in that order along the direction of rotation of the platen 24.

Although FIG. 3B illustrate the nozzles 154 as spaced at even intervals, this is not required. In addition, although FIGS. 3A and 3B illustrate nine nozzles, there could be a larger or smaller number of nozzles, e.g., three to twenty nozzles.

The polishing apparatus 2 can also include the controller 12 to control operation of various components, e.g., the temperature control system 100. The controller 12 is configured to receive the temperature measurements from the temperature sensor 64 for each radial zone of the polishing pad. The controller 12 can compare the measured temperature profile to a desired temperature profile, and generate a feedback signal to a control mechanism (e.g., actuator, power source, pump, valve, etc.) for each nozzle or opening. The feedback signal is calculated by the controller 12 e.g., based on an internal feedback algorithm, to cause the control mechanism to adjust the amount of cooling or heating such that the polishing pad and/or slurry reaches (or at least moves closer to) the desired temperature profile.

In some implementations, the polishing station 20 includes a wiper blade or body 170 to evenly distribute the polishing liquid 38 across the polishing pad 30. Along the direction of rotation of the platen 24, the wiper blade 170 can be between the slurry dispenser 39 and the carrier head 70.

FIG. 3B illustrates separate arms for each subsystem, e.g., the heating system 102, cooling system 104 and rinse system 106, various subsystems can be included in a single assembly supported by a common arm. For example, an assembly can include a cooling module, a rinse module, a heating module, a slurry delivery module, and optionally a wiper module. Each module can include a body, e.g., an arcuate body, that can be secured to a common mounting plate, and the common mounting plate can be secured at the end of an arm so that the assembly is positioned over the polishing pad 30. Various fluid delivery components, e.g., tubing, passages, etc., can extend inside each body. In some implementations, the modules are separately detachable from the mounting plate. Each module can have similar components to carry out the functions of the arm of the associated system described above.

Referring to FIG. 4A, steam for the processes described in this description, or for other uses in a chemical mechanical polishing system, can be generated using a steam generator 410. An exemplary steam generator 410 can include a canister 420 that encloses an interior volume 425. The walls of the canister 420 can be made of a thermally insulating material with a very low level of mineral contaminants, e.g., quartz. Alternatively, the walls of the canister could be formed of another material, e.g., and an interior surface of the canister could be coated with polytetrafluoroethylene (PTFE) or another plastic. In some implementations, the canister 420 can be 10-20 inches long, and 1-5 inches wide.

Figure 4B:
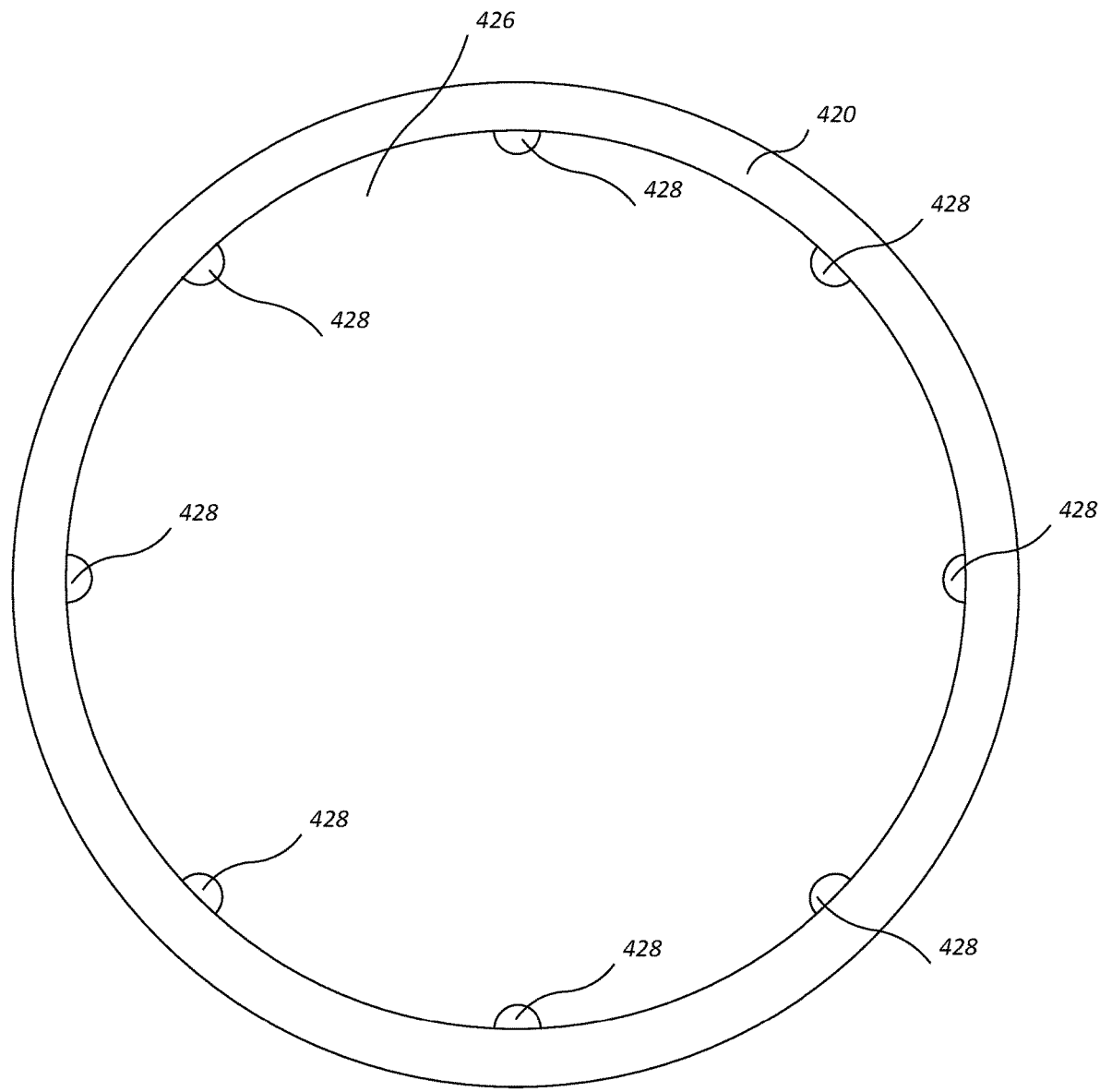
FIG. 4B is a schematic cross-sectional top view of an example steam generator.

Referring to FIGS. 4A and 4B, in some embodiments, the interior volume 425 of the canister 420 is divided into a lower chamber 422 and an upper chamber 424 by a barrier 426. The barrier 426 can be made of the same material as the canister walls, e.g., quartz, stainless steel, aluminum, or a ceramic such as alumina. Quartz may be superior in terms of lower risk of contamination. The barrier 426 can include one or more apertures 428. The apertures 428 can be located at the edges, e.g., only at the edges, of the barrier 426 where the barrier 426 meets the inner walls of the canister 420. The apertures 428 can be located near the edges of the barrier 426, e.g., between the edge of the barrier 426 and the center of the barrier 426. In some implementations, apertures are also positioned away from the edges, e.g., across the width of the barrier 426, e.g., uniformly spaced across the area of the barrier 425. The barrier 426 can substantially prevent the liquid water 440 from entering the upper chamber 424 by blocking water droplets splattered by the boiling water. This permits the dry steam to accumulate in the upper chamber 424. The apertures 428 permit the steam to pass from the lower chamber 422 into the upper chamber 424. The apertures 428—and particularly the apertures 428 near the edge of the barrier 426—can allow for condensation on the walls of the upper chamber 424 to drip down into the lower chamber 422 to reduce the liquid content in the upper chamber 426 and permit the liquid to be reheated with the water 440.

Referring to FIG. 4A, a water inlet 432 can connect a water reservoir 434 to the lower chamber 422 of the canister 420. The water inlet 432 can be located at or near the bottom of the canister 420 to provide the lower chamber 422 with water 440.

One or more heating elements 430 can surround a portion of the lower chamber 422 of the canister 420. The heating element 430, for example, can be a heating coil, e.g., a resistive heater, wrapped around the outside of the canister 420. The heating element can also be provided by a thin film coating on the material of the side walls of the canister; if current is applied then this thin film coating can serve as a heating element.

The heating element 430 can also be located within the lower chamber 422 of the canister 420. For example, the heating element can be coated with a material that will prevent contaminants, e.g., metal contaminants, from the heating element from migrating into the steam.

The heating element 430 can apply heat to a bottom portion of the canister 420 up to a minimum water level 443a. That is, the heating element 430 can cover portions of the canister 420 that is below the minimum water level 443a to prevent overheating, and to reduce unnecessary energy expenditures.

A steam outlet 436 can connect the upper chamber 424 to a steam delivery passage 438. The steam delivery passage 438 can be located at the top or near the top of the canister 420, e.g., in the ceiling of the canister 420, to allow steam to pass from the canister 420 into the steam delivery passage 438, and to the various components of the CMP apparatus. The steam delivery passage 438 can be used to funnel steam towards various areas of the chemical mechanical polishing apparatus, e.g., for steam cleaning and preheating of the carrier head 70, substrate 10, and pad conditioner disk 92.

Referring to FIG. 4A, in some embodiments, a filter 470 is coupled to the steam outlet 438 configured to reduce contaminants in the steam 446. The filter 470 can be an ion-exchange filter.

Water 440 can flow from the water reservoir 434 through the water inlet 432 and into the lower chamber 422. The water 440 can fill the canister 420 at least up to a water level 442 that is above the heating element 430 and below the barrier 426. As the water 440 is heated, gas media 446 is generated and rises through the apertures 428 of the barrier 426. The apertures 428 permit steam to rise and simultaneously permit condensation to fall through, resulting in a gas media 446 in which the water is steam that is substantially free of liquid (e.g., does not have liquid water droplets suspended in the steam).

In some embodiments, the water level is determined using a water level sensor 460 measuring the water level 442 in a bypass tube 444. The bypass tube connects the water reservoir 434 to the steam delivery passage 438 in parallel with the canister 420. The water level sensor 460 can indicate where the water level 442 is within the bypass tube 444, and accordingly, the canister 420. For example, the water level sensor 444 and the canister 420 are equally pressured (e.g., both receive water from the same water reservoir 434 and both have the same pressure at the top, e.g., both connect to the steam delivery passage 438), so the water level 442 is the same between the water level sensor and the canister 420. In some embodiments, the water level 442 in the water level sensor 444 can otherwise indicate the water level 442 in the canister 420, e.g., the water level 442 in the water level sensor 444 is scaled to indicate the water level 442 in the canister 420.

In operation, the water level 442 in the canister is above a minimum water level 443*a* and below a maximum water level 443*b*. The minimum water level 443*a* is at least above the heating element 430, and the maximum water level 443*b* is sufficiently below the steam outlet 436 and the barrier 426 such that enough space is provided to allow gas media 446, e.g., steam, to accumulate near the top of the canister 420 and still be substantially free of liquid water.

In some embodiments, the controller 12 is coupled to a valve 480 that controls fluid flow through the water inlet 432, a valve 482 that controls fluid flow through the steam outlet 436, and/or the water level sensor 460. Using the water level sensor 460, the controller 12 is configured to regulate the flow of water 440 going into the canister 420 and regulate the flow of gas 446 leaving the canister 420 to maintain a water level 442 that is above the minimum water level 443*a* (and above the heating element 430), and below the maximum water level 443*b* (and below the barrier 426, if there is a barrier 426). The controller 12 can also be coupled to a power source 484 for the heating element 430 in order to control the amount of heat delivered to the water 440 in the canister 420.

Referring to FIGS. 1, 2A, 2B, 3A, 3B, and 4A, the controller 12 can monitor the temperature measurements received by the sensors 64, 214, and 264 and control the temperature control system 100, the water inlet 432, and the steam outlet 436. The controller 12 can continuously monitor the temperature measurements and control the temperature in a feedback loop, to tune the temperature of the polishing pad 30, the carrier head 70, and the conditioning disk 92. For example, the controller 12 can receive the temperature of the polishing pad 30 from the sensor 64, and control the water inlet 432 and the steam outlet 436 to control the delivery of steam onto the carrier head 70 and/or conditioner head 93 to raise the temperatures of the carrier head 70 and/or the conditioner head 93 to match the temperature of the polishing pad 30. Reducing the temperature difference can help prevent the carrier head 70 and/or the conditioner head 93 from acting as heat sinks on a relatively higher temperature polishing pad 30, and can improve within-wafer uniformity.

In some embodiments, the controller 12 stores a desired temperature for the polishing pad 30, the carrier head 70, and the conditioner disk 92. The controller 12 can monitor the temperature measurements from the sensors 64, 214, and 264 and control the temperature control system 100, the water inlet 432, and the steam outlet 436 to bring the temperatures of the polishing pad 30, the carrier head 70, and/or the conditioner disk 92 to the desired temperature. By causing the temperatures to achieve a desired temperature, the controller 12 can improve within-wafer uniformity and wafer-to-wafer uniformity.

Alternatively, the controller 12 can raise the temperatures of the carrier head 70 and/or the conditioner head 93 to slightly above the temperature of the polishing pad 30, to allow for the carrier head 70 and/or the conditioner head 93 to cool to the same or substantially the same temperature of the polishing pad 30 as they move from their respective cleaning and pre-heating stations to the polishing pad 30.

In another process, the temperature of the polishing liquid 38 is raised for a bulk polishing operation. Following the bulk polishing operation, the temperature of the various components of the carrier head 70 (e.g., the polishing surface 36, the conditioner disk 92) can be cooled for metal clearing, over-polish, and/or conditioning operations.

A number of embodiments of the invention have been described. Nevertheless, it will be understood that various modifications may be made without departing from the spirit and scope of the invention. Accordingly, other embodiments are within the scope of the following claims.

What is claimed is:

1. A method of chemical mechanical polishing, comprising:
    bulk polishing of a substrate with a polishing pad, a polishing surface of the polishing pad having a first temperature;
    metal clearing the substrate; and
    over-polishing, after the metal clearing, the substrate with the polishing pad with a temperature of the polishing surface of the polishing pad lowered for the over-polishing by a coolant to have a second temperature that is lower than the first temperature of the polishing surface of the polishing pad during bulk polishing.

2. The method of claim 1, wherein lowering the temperature includes flowing the coolant onto the polishing surface through one or more nozzles suspended on an arm over the polishing surface of the polishing pad.

3. The method of claim 2, wherein the coolant comprises a liquid coolant medium.

4. The method of claim 3, wherein the liquid coolant medium comprises one or more of liquid nitrogen or water.

5. The method of claim 2, wherein the coolant comprises a gas coolant medium.

6. The method of claim 5, wherein the gas coolant medium includes nitrogen or carbon dioxide.

7. The method of claim 5, comprising flowing the gas coolant medium from a source of compressed gas.

8. The method of claim 5, comprising directing the gas coolant medium through a vortex tube to direct a cold stream of gas onto the polishing pad.

9. The method of claim 2, comprising starting and stopping fluid flow through the one or more nozzles.

10. A method of chemical mechanical polishing, comprising:
- bulk polishing of a substrate with a polishing pad, a polishing surface of the polishing pad having a first temperature; and
- conditioning the polishing pad with a temperature of the polishing surface of the polishing pad lowered by a coolant for the conditioning to have a second temperature that is lower than the first temperature of the polishing surface of the polishing pad during bulk polishing.

11. The method of claim 10, wherein lowering the temperature includes flowing the coolant onto the polishing surface through one or more nozzles suspended on an arm over the polishing surface of the polishing pad.

12. The method of claim 11, wherein the coolant comprises a liquid coolant medium.

13. The method of claim 12, wherein the liquid coolant medium comprises one or more of liquid nitrogen or water.

14. The method of claim 11, wherein the coolant comprises a gas coolant medium.

15. The method of claim 14, wherein the gas coolant medium includes nitrogen or carbon dioxide.

16. The method of claim 14, comprising flowing the gas coolant medium from a source of compressed gas.

17. The method of claim 14, comprising directing the gas coolant medium through a vortex tube to direct a cold stream of gas onto the polishing pad.

18. The method of claim 11, comprising starting and stopping fluid flow through the one or more nozzles.

* * * * *